United States Patent
Reit et al.

(10) Patent No.: US 10,736,212 B2
(45) Date of Patent: Aug. 4, 2020

(54) SUBSTRATES FOR STRETCHABLE ELECTRONICS AND METHOD OF MANUFACTURE

(71) Applicant: Ares Materials, Inc., Dallas, TX (US)

(72) Inventors: Radu Reit, Carrollton, TX (US); David Arreaga-Salas, Garland, TX (US)

(73) Assignee: ARES MATERIALS INC., Dallas, TX (US)

( * ) Notice: Subject to any disclaimer, the term of this patent is extended or adjusted under 35 U.S.C. 154(b) by 222 days.

(21) Appl. No.: 15/698,426

(22) Filed: Sep. 7, 2017

(65) Prior Publication Data

US 2017/0374736 A1    Dec. 28, 2017

Related U.S. Application Data

(63) Continuation-in-part of application No. 15/494,000, filed on Apr. 21, 2017.
(Continued)

(51) Int. Cl.
*H05K 1/02* (2006.01)
*H05K 1/03* (2006.01)
(Continued)

(52) U.S. Cl.
CPC ......... *H05K 1/0283* (2013.01); *H05K 1/0393* (2013.01); *H05K 3/0014* (2013.01); *H05K 3/0055* (2013.01); *H01L 27/1218* (2013.01); *H01L 51/0097* (2013.01); *H05K 1/189* (2013.01); *H05K 3/0023* (2013.01); *H05K 2201/0141* (2013.01); *H05K 2201/0187* (2013.01); *H05K 2203/0143* (2013.01);
(Continued)

(58) Field of Classification Search
CPC .. H05K 1/0283; H05K 1/0393; H05K 3/0014; H05K 3/0055
See application file for complete search history.

(56) References Cited

U.S. PATENT DOCUMENTS

| 5,618,898 A | 4/1997 | Nagasawa et al. |
| 5,718,947 A | 2/1998 | Martin et al. |

(Continued)

FOREIGN PATENT DOCUMENTS

| JP | 2015202674 A | 11/2015 |
| WO | 2015170096 A1 | 11/2015 |
| WO | 2017034858 A1 | 3/2017 |

OTHER PUBLICATIONS

Peng et al. "Facile Image Patterning via sequential Thiol-Michael/Thiol-Yne Click Reactions" (Nov. 10, 2014).*
(Continued)

*Primary Examiner* — Austin Murata
(74) *Attorney, Agent, or Firm* — McGuireWoods LLP

(57) ABSTRACT

A bulk substrate for stretchable electronics. The bulk substrate is manufactured with a process that forms a soft-elastic region of the bulk substrate. The soft-elastic region includes a strain capacity of greater than or equal to 25% and a first Young's modulus below 10% of a maximum local modulus of the bulk substrate. The process also forms a stiff-elastic region of the bulk substrate. The stiff-elastic region includes a strain capacity of less than or equal to 5% and a second Young's modulus greater than 10% of the maximum local modulus of the bulk substrate.

6 Claims, 5 Drawing Sheets

Related U.S. Application Data

(60) Provisional application No. 62/384,514, filed on Sep. 7, 2016, provisional application No. 62/413,330, filed on Oct. 26, 2016, provisional application No. 62/339,410, filed on May 20, 2016, provisional application No. 62/339,418, filed on May 20, 2016.

(51) Int. Cl.
    *H05K 3/00*   (2006.01)
    *H01L 51/00*  (2006.01)
    *H05K 1/18*   (2006.01)
    *H01L 27/12*  (2006.01)

(52) U.S. Cl.
    CPC ............ *H05K 2203/0796* (2013.01); *H05K 2203/095* (2013.01); *H05K 2203/1163* (2013.01); *H05K 2203/1194* (2013.01); *H05K 2203/1476* (2013.01); *H05K 2203/1545* (2013.01)

(56) References Cited

U.S. PATENT DOCUMENTS

| | | |
|---|---|---|
| 8,884,433 B2 | 11/2014 | Lin et al. |
| 2003/0017679 A1 | 1/2003 | Lee et al. |
| 2010/0279125 A1 | 11/2010 | Buyuktanir et al. |
| 2011/0049768 A1 | 3/2011 | Hu et al. |
| 2011/0183027 A1 | 7/2011 | Miller et al. |
| 2014/0073755 A1 | 5/2014 | Seferos et al. |
| 2014/0240932 A1* | 8/2014 | Hsu .................. H05K 1/189 361/749 |
| 2014/0323647 A1 | 10/2014 | Martin et al. |
| 2015/0018659 A1 | 1/2015 | Ware et al. |

OTHER PUBLICATIONS

Ware et al. "Thiol-ene/acrylate substrates for softening intracortical electrodes" (May 13, 2013).*

International Search Report and Written Opinion issued in corresponding International Patent Application No. PCT/US17/58586; dated Jan. 4, 2018.

T. Ware, et al.; "Thiol-ene/acrylate substrates for softening intracortical electrodes"; Journal of Biomaterials Research Part B; May 13, 2013; abstract pp. 2-6, 8, 10; vol. 102 B.

H. Peng, et al.; "Facile Image Patterning via Sequential Thiol-Michael/Thiol-yne Click Reaction"; Chemistry of Materials, Nov. 10, 2014; pp. 6819-6826, 6821-6822; vol. 26.

S. Blackburn; "Synthesis of High refractive Index Silicone Materials Incorporating Aromatic Moieties with Adjacent Linkage Groups for Flexible Electronic Displays"; Silicon; Apr. 28, 2016; title, p. 1.

International Search Report and Written Opinion for corresponding International Patent Application No. PCT/US2017/028879; dated Jul. 6, 2017.

Pawin, Solanki, et al., "A Quantitative Approach to Hydrogen Bonding at a Metal Surface", Journal of the American Chemical Society, 2007, 112056-12057, 29 (40).

\* cited by examiner

SUBSTRATES FOR STRETCHABLE ELECTRONICS AND METHOD OF MANUFACTURE

CROSS-REFERENCE TO RELATED APPLICATIONS

This application claims benefit and priority under 35 U.S.C. § 119(e) of U.S. Provisional Application No. 62/384,514, filed Sep. 7, 2016. This application is also a Continuation-in-Part application of co-pending U.S. Non-Provisional patent application Ser. No. 15/494,000, filed Apr. 21, 2017, which claims benefit and priority under 35 U.S.C. § 119(e) of U.S. Provisional Application No. 62/413,330, filed Oct. 26, 2016, U.S. Provisional Application No. 62/339,410, filed May 20, 2016, and U.S. Provisional Application No. 62/339,418, filed May 20, 2016, the disclosures of which are incorporated by reference herein in their entirety for all purposes.

TECHNICAL FIELD

The present disclosure relates to the use of substrates for stretchable electronics, and, more particularly, to the use of manufactured substrates having a soft-elastic region comprising a strain capacity of greater than 25% and a first Young's modulus below 10% of a maximum local modulus of the bulk substrate; and a stiff-elastic region comprising a strain capacity of less than 5% and a second Young's modulus greater than 10% of the maximum local modulus of the bulk substrate.

BACKGROUND

Stretchable electronics are a class of electronic materials, components, and devices that allow for the straining of an electronics stack such that the entirety of the device (substrate, backplane, interconnects, etc.) can be stretched without significant degradation of the behavior of electronic components. Typically, this involves the fabrication of electronic components atop an elastomeric substrate.

More importantly, multilayer structures such as metal-insulator-metal (MIM) capacitors, diodes, transistors and others, currently require a rigid form factor. While geometric solutions can address the flexibility of such structures (e.g., thin-film variations of such structures can accommodate smaller bending radii), the stretchability of such a device is still limited. Current methods address this limitation through the lamination of stiff 'islands' atop the stretchable elastomer base, requiring only interconnects to be strain tolerant. However, this lamination leads to interfacial issues that can manifest at intermediate and high strains of the elastomeric substrate onto which the stiff substrate materials are laminated.

BRIEF SUMMARY

In the presently disclosed subject matter, a method is provided for the fabrication of a bulk substrate with soft regions and stiff regions patterned directly into a material. Soft regions and stiff regions patterned directly into the material may reduce the presence of multi-material interfacing (e.g., adhesives, surface lamination, etc.) to achieve a similar multi-modulus substrate that may enable stretchable electronic stack fabrication. The method involves the use of a bulk material that can exhibit multi-modulus behavior that is spatially-controlled either during the synthesis of the bulk material, or as a function of the post-polymerization modification of the bulk material.

BRIEF DESCRIPTION OF THE DRAWINGS

Illustrative examples of the present disclosure are described in detail below with reference to the attached drawing figures, which are incorporated by reference herein, and wherein.

Figure 1:
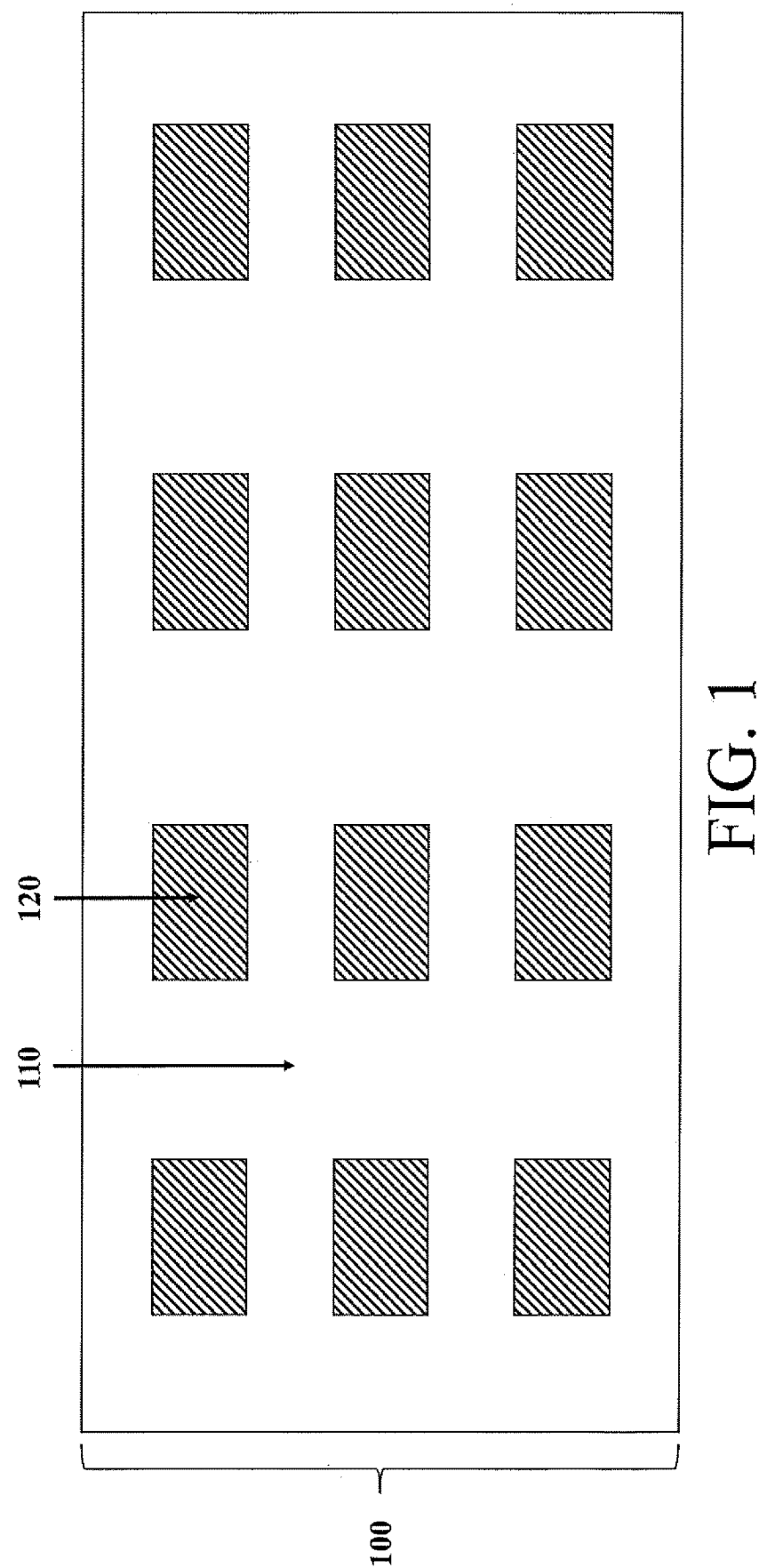
FIG. 1 is a top-down schematic view of a multi-modulus substrate with regions of variable modulus in accordance with the embodiments disclosed herein.

The illustrated figures are only exemplary and are not intended to assert or imply any limitation with regard to the environment, architecture, design, or process in which different examples may be implemented.

DETAILED DESCRIPTION

In the present disclosure, a method for the manufacture of bulk substrates for stretchable electronics is described via the manufacturing of a material without adhered interfaces between soft elastic regions (those exhibiting a strain capacity above 25%) and stiff elastic regions (those exhibiting a strain capacity below 5%). In particular, the material without the adhered interfaces between the soft elastic regions and the stiff elastic regions may be defined as a continuous, multiphase material. Through the selective fabrication of patterned structure regions within the bulk material, various properties such as the Young's modulus, the coefficient of thermal expansion, the Poisson ratio, and others can be spatially tuned in a bulk material absent adhered interfaces between such regions.

Without limitation by theory, dissimilar material properties may be used to enable substrates for stretchable electronics via the introduction of local versus global strain. Briefly, this phenomenon allows a macroscopic device (e.g., a sensor array or a display) to strain above the strain capacity of the most brittle material used in the electronic device stack. By introducing a discrete stiff elastic region within the substrate with a modulus higher than the modulus of the soft elastic region, any strain applied to the entire material may be preferentially applied to the soft elastic region at a rate $[E_{stiff}/E_{soft}]$ times more than the strain in the rigid elastic region. In an example, a material has two dissimilar modulus regions, including a soft elastic region having a Young's modulus of 10 MPa and a stiff elastic region having a Young's modulus of 2 GPa. Given a 90% volume fraction of the soft elastic region and a 10% volume fraction for the stiff elastic region, the overall modulus may be approximated by the following equation:

$$E_{bulk} = \left[ \frac{\chi}{E_{soft}} + \frac{(1-\chi)}{E_{rigid}} \right]^{-1}$$

This example may yield a combined modulus of 11.1 MPa for the entirety of the material, allowing calculation of total strain via the Hookean formula:

$$\sigma_{bulk} = E_{bulk} * \varepsilon_{bulk} \quad \text{(equation 2)}.$$

Given an example stress ($\sigma$) of 5 MPa, the total strain ($\varepsilon$) is calculated as 0.45 m/m, or 45% elongation if the stress is applied in tension. To calculate the strains in each material, it may be assumed that the stresses are equally distributed through all layers in a material, as shown in the following equation:

$$E_{soft} * \varepsilon_{soft} = \sigma_{soft} = \sigma_{bulk} = \sigma_{rigid} = E_{rigid} * \varepsilon_{rigid} \quad \text{(equation 3)}$$

Therefore, the strain in the soft region is defined by the following equation:

$$\varepsilon_{bulk} = \varepsilon_{soft} + \varepsilon_{rigid} = \varepsilon_{soft} + \varepsilon_{soft} * \frac{E_{soft}}{E_{rigid}}. \quad \text{(equation 4)}$$

As the rigid section has a modulus that is more than 2 orders of magnitude greater than the soft section, the majority of the strain is directed through the soft region of the material. In the application of flexible electronics, this may allow for the microfabrication of components on the stiff region that are typically not strain tolerant or are required to have critically accurate electrical properties (e.g., capacitors, diodes, transistors, bias resistors, etc.). In addition, components with form factors that have already been demonstrated to accommodate higher strains (e.g. interconnects, etc.), or components whose variance of properties with strain is accepted (e.g., non-critical-valued passives, etc.), may be deposited on the soft region. Together this may enable a high-performance electronic device that when stretched will primarily deform in the soft region, which may enable continued function of electronic devices despite the mechanical limitations of some of the included components.

In the present disclosure, adhered interfaces are primarily referenced to highlight dissimilar materials (modulus, thermal expansion, etc.) that were joined via lamination (e.g., with or without an adhesive), codeposition (e.g., patterned precipitation of solutes out of solvents), mechanically bonded (e.g. friction welded, melted into each other), or any other mechanism that requires two or more different starting materials (e.g., films, solutions, etc.) to yield the variable stiffness regions described herein. In embodiments, all materials use material processing techniques to introduce regions of variable stiffness in a single material which may otherwise prefer to display isotropic mechanical properties. Specifically, the prealignment of the directorate via imprinting a pre-patterned command surface may enable liquid-crystalline materials to exhibit variable mechanical properties while loaded along the nematic director versus a load perpendicular to the nematic director.

Similarly, amorphous materials may be spatially patterned post-polymerization of the film via multiple methodologies. In an example involving ionomers, the ions that physically crosslink the polymer may be exchanged to form materials that have transition temperatures that are more than 100° C. higher by exchanging the cation. Exchange of the ionomer's physical crosslink may be achieved in wet conditions via an ionic solution or in dry conditions via an ambient ionic environment. Ionic solutions include, but are not limited to, strong acids (e.g., HCl, $H_2SO_4$, etc.), strong bases (e.g., NaOH, KOH, etc.), and salt solutions (e.g., NaCl, KCl, etc.). Ionic environments include, but are not limited to, ionic plasmas and sputtering.

Another methodology to increase the transition of materials may be seen by varying the valency of sulfur in a thioether linkage from 2 [poly (arylene thioether imide)] to 6 [poly (arylene sulfone imide)] via the post-polymerization oxidation of the thioether linkage. By oxidizing the thioether linkage, a glass transition ($T_g$) increase of up to 120° C. may be observed, depending on the concentration of sulfur in the polymer backbone. Oxidation of the thioether linkage may be achieved in wet conditions via an oxidant solution or in dry conditions via an ambient oxidizing environment. Oxidizing solutions of aqueous mixtures include, but are not limited to, hydrogen peroxide ($H_2O_2$) and other peroxides, nitric acid ($HNO_3$) and nitrate compounds, sulfuric acid ($H_2SO_4$), peroxydisulfuric acid ($H_2S_2O_8$), peroxymonosulfuric acid ($H_2SO_5$), hypochlorite and other hypohalite compounds such as household bleach (NaClO), permanganate compounds such as potassium permanganate ($KMnO_4$), sodium perborate ($NaBO_3 \cdot nH_2O$), nitrous oxide ($N_2O$), potassium nitrate ($KNO_3$), and combinations thereof. Oxidizing atmospheres include, but are not limited to, oxygen plasmas and ozone plasmas.

The disclosed materials may be manufactured by traditional polymer film fabrication techniques, including, but not limited to, slot-die coating, blade coating, spin coating, solvent casting, extrusion, coextrusion, injection molding and reactive injection molding. In a specific example, the liquid crystalline polymers may be deposited through slot-die coating of a liquid crystal monomer solution atop a carrier web that has been pre-patterned to contain the command layer that drives the liquid crystal orientation. In an embodiment, this monomer solution may be ejected from the slot-die coater directly atop a carrier web that has been pre-patterned with the command structure for directing anisotropic liquid crystal alignment. In another embodiment, the monomer solution may be ejected between two carrier webs, spaced at a fixed distance, which dictates the ultimate thickness of the substrate material. In both cases, the alignment web may or may not have a pre-patterned command structure. In another example, the ionomeric and thiol-click networks may be similarly deposited via the polymer film fabrication techniques described above, without the alignment of the bulk film using a command structure. After fabrication of the substrate film, selective areas atop the material may be modified via the methods described above to increase the transition temperature of the substrate material. This modification may be achieved through multiple spatially-defining techniques including, but not limited to photolithography, shadow masking, nanoimprint lithography, and transfer printing.

In some embodiments, the bulk material with spatially-defined anisotropic regions is a liquid crystalline elastomer, where spatial anisotropy is introduced via the variable alignment of the directorate within the bulk network. In one example, the directorate may be spatially-aligned such that small regions of the bulk material have a directorate orientation perpendicular to the bulk orientation of the film. In this example, stress applied in the direction of the bulk material may result in a majority of strain being localized at the spatially-defined anisotropic regions with a directorate alignment 90° to the bulk orientation. In such an example, the spatially-defined anisotropic regions may behave as soft-elastic regions. In an additional example, the bulk thickness of a bulk material may be spatially-patterned to have a twisted nematic orientation (wherein the directorate orientation can change up to 90° through the thickness within any given voxel of the material), such that a stress applied in any orientation will result in the patterned regions behaving as stiff-elastic regions.

In other embodiments, the bulk material with spatially-defined anisotropic regions is an ion-exchanged ionomer, where spatial anisotropy is introduced via the selective patterning of the substrate with ionic solutions containing anions or cations. In one example, a poly(acrylic acid) ionomer can be spatially-patterned via the introduction of 1.0 M NaOH atop the masked film, and a mask of the masked film may be a shadowmask, a patterned photoresist mask, or a patterned hardmask. It may be appreciated that NaOH may be substituted with any strong basic media where the cation of the base is of increasing atomic size (e.g., H<Li<Na<K, etc.) or increasing electronegativity (e.g., Na<Mg and K<Ca) to lead to an increased transition. In the present example, regions exposed to the concentrated alkaline solution will exchange a proton from the acrylic acid groups for the labile sodium in solution, allowing for a local increase in a glass transition temperature ($T_g$) from 106° C. (poly(acrylic acid)) to a $T_g$ of 220° C. (poly(sodium acrylate)). This allows for stresses applied above 106° C. but below 220° C. to preferentially strain the soft-elastic regions of poly(acrylic acid) and minimize strain on the stiff-elastic regions of poly(sodium acrylate).

Figure 2:
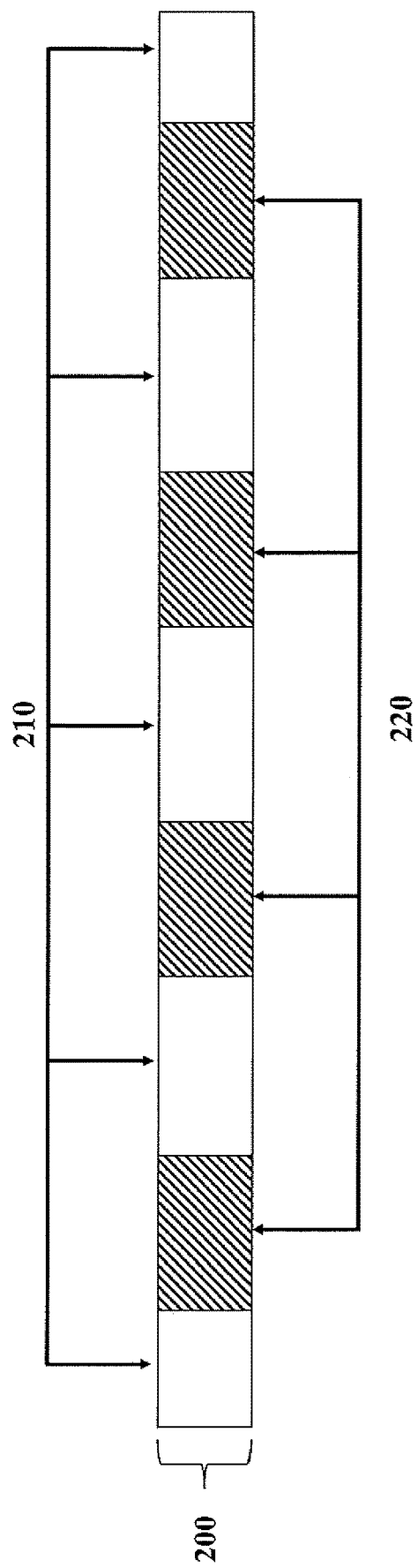
FIG. 2 is a cross-sectional schematic view of the multi-modulus substrate of FIG. 1 with rigid elastic regions aligned through an entire depth of the multi-modulus substrate in accordance with the embodiments disclosed herein.
Figure 3:
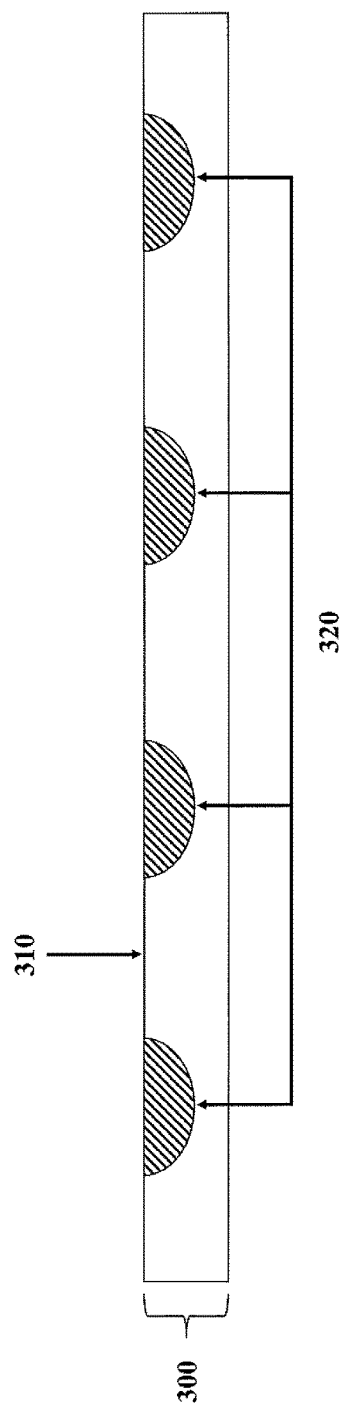
FIG. 3 is a cross-sectional schematic view of the multi-modulus substrate of FIG. 1 with rigid elastic regions inserted in a continuous soft elastic region in accordance with the embodiments disclosed herein.

In additional embodiments, the bulk material with spatially-defined anisotropic regions may be an oxidized thiol-click polymer, where spatial anisotropy is introduced via the selective patterning of the substrate with a strong oxidant. In a specific example, a thiol-ene copolymer is synthesized with an unoxidized $T_g$ of 0° C., and a spatial pattern is introduced atop the material via a shadowmask, a patterned photoresist mask or a patterned hardmask. The thiol-ene copolymer, or another initially synthesized material, may begin with properties of a soft-elastic material. For example, the properties of the soft-elastic material may be greater than 25% elastic strain capacity and a modulus of less than 50 MPa. Next, a solution of 30% $H_2O_2$ is flowed atop the material and allowed to oxidize the exposed surface of the material for 60 minutes. This patterning step defines anisotropic regions of a higher modulus in the initially synthesized material, but the anisotropic regions of the higher modulus are defined isotropically. Namely, the oxidation of the thioether is diffusion-limited, which results in a formation of a hemispherical cross-section, as shown in FIG. 3. In other embodiments, as illustrated in FIG. 2, the oxidation results in a formation that extends through an entire thickness of the initially synthesized material. In such an embodiment, the extension of the oxidation through the entire thickness of the initially synthesized material is a result of having minimum feature sizes that are larger than a thickness of the initially synthesize material.

It may be appreciated that the solution of 30% $H_2O_2$ may be substituted with other concentrations of hydrogen peroxide, other inorganic peroxides, nitric acid and nitrate compounds, sulfuric acid, peroxydisulfuric acid, peroxymonosulfuric acid, hypochlorite and other hypohalite compounds including household bleach, permanganate compounds such as potassium permanganate, sodium perborate, nitrous oxide, and potassium nitrate, among other compounds. The solution is then flushed with deionized water, the remaining mask is removed, and the bulk material is baked at 85° C. for 12 hours. Flushing the solution with deionized water may occur for approximately 10 seconds, and the flushing step may generally influence the formation of the two spatially-defined anisotropic regions described herein. Further, baking the bulk material may also occur in a temperature range from 80° C. to 150° C. at baking times between 10 minutes and 12 hours. In an embodiment, multi-stage curing processes may be performed. For example, a first curing step occurs between 80° C. and 120° C. and a second curing step occurs between 120° C. and 150° C. In this example, regions exposed to the oxidant will increase the oxidization of the thioether linkage of the thiol-ene copolymer to either a sulfoxide or sulfone, increasing the $T_g$ to 100° C. This allows for stresses applied above 0° C. but below 100° C. to preferentially strain the soft-elastic regions of unoxidized thiol-ene copolymer and minimize strain on the stiff-elastic regions of oxidized thiol-ene copolymer.

In all of the embodiments, a bulk material was used as a substrate material with anisotropic mechanical properties. No adhered interfaces exist between the stiff-elastic and soft-elastic regions, and covalent linkages between such regions exist in all cases.

In some embodiments, the thiol-click polymer may be prepared by curing a monomer mixture. The monomer mixture may comprise from about 25 wt % to about 65 wt % of one or more multifunctional thiol monomers and from about 25 wt % to about 65 wt % of one or more multifunctional co-monomers. The flexible electronics stack may further comprise an interfacial adhesion layer and a rigid electronic component. The monomer mixture may further comprise from about 0.001 wt % to about 10 wt % of small molecule additive. The small molecule additive may comprise an acetophenone; a benzyl compound; a benzoin compound; a benzophenone; a quinone; a thioxanthone; azobisisobutyronitrile; benzoyl peroxide; hydrogen peroxide; or a combination thereof. The multifunctional thiol monomers may comprise trimethylolpropane tris(3-mercaptopropionate); trimethylolpropane tris(2-mercaptoacetate); pentaerythritol tetrakis(2-mercaptoacetate); pentaerythritol tetrakis(3-mercaptopropionate); 2,2'-(ethylenedioxy)diethanethiol; 1,3-Propanedithiol; 1,2-ethanedithiol; 1,4-butanedithiol; tris[2-(3-mercaptopropionyloxy)ethyl] isocyanurate; 3,4-ethylenedioxythiophene; 1,10-decanedithiol; tricyclo[5.2.1.02,6] decanedithiol; Benzene-1,2-dithiol; and trithiocyanuric acid; dipentaerythritol hexakis(3-mercaptopropionate); 2,3-Di((2-mercaptoethyl)thio)-1-propanethiol; Dimercaptodiethylsulfide; Ethoxylated Trimethylpropan-tri (3-mercapto-propionate); Ethoxylated Trimethylpropantri (3-mercapto-propionate); Polycaprolactone tetra 3-mercaptopropionate; Di-Pentaerythritolhexakis (3-mercaptopropionate); Di-Trimethylolpropanetetra (3-mercaptopropionate); Glycoldi (3-mercaptopropionate); Pentaerythritoltetramercaptoacetate; Trimethylol-propanetri-mercaptoacetate; Glycoldi-mercaptoacetate; or a combination thereof. The multifunctional co-monomers may comprise 1,3,5-triallyl-1,3,5-triazine-2,4,6 (1 H,3 H,5 H)-trione; tricyclo[5.2.1.02,6] decanedimethanol diacrylate; divinyl benzene; diallyl bisphenol A (diacetate ether); diallyl terephthalate; diallyl phthalate; diallyl maleate; trimethylolpropane diallyl ether; ethylene glycol dicyclopentenyl ether acrylate; diallyl carbonate; diallyl urea; 1,6-hexanediol diacrylate; cinnamyl cinnamate; vinyl cinnamate; allyl cinnamate; allyl acrylate; crotyl acrylate; cinnamyl methacrylate; trivinylcyclohexane; 1,4-cyclohexanedimethanol divinyl ether; poly(ethylene glycol) diacrylate; tricyclodecane dimethanol diacrylate; bisphenol A ethoxylate diarylate; tris[2-(acryloyloxy ethyl)] isocyanurate; trimethylolpropane triacrylate; pentaethrytolpropane tetraacrylate; dipentaethrytolpropane penta-/hexa-acrylate; poly(ethylene glycol) dimethacrylate; dimethanol dimethacrylate; bisphenol A ethoxylate dimetharylate; trimethylolpropane trimethacrylate; pentaethrytolpropane tetramethacrylate; bi sphenol A diglycidyl Ether; neopentyl glycol diglycidyl ether; tris (2,3-epoxypropyl) isocyanurate; trimethylolpropane triglycidyl ether i. 1,1'-(methylenedi-4,1-phenylene) bismaleimide; 1,6-di(maleimido)hexane; 1,4-di(maleimido)butane; N,N'-(1,3-phenylene)dimaleimide; isophorone diisocyanate; xylylene diisocyanate; tolylene diisocyanate; 1,4-diisocyanatobutane, 1,6-diisocyanatohexane, 1,8-diisocyanatooctane; vinyl norbornene; dicyclopentadiene; ethylidene norbornene; or a combination thereof.

FIG. 1 demonstrates a top-down schematic view of a substrate 100 for stretchable electronics with a soft-elastic region 110 exhibiting soft-elastic properties and stiff-elastic regions 120 exhibiting stiff-elastic properties. In such an architecture, electronic stacks, which favor minimal strain for continued function (e.g., thin-film transistors), may be selectively fabricated atop the stiff-elastic regions 120. Additionally, interconnects between each of these structures may be selected from a group of stretchable conductors that are capable of accommodating the strain observed by any material deposited along the soft-elastic region 110. Further, it may be appreciated that the substrate 100 encompasses a continuous material (e.g., no laminated or adhered interfaces) with the soft-elastic region 110, which includes an elastic strain capacity greater than 25%, and the stiff-elastic regions 120, which include an elastic strain capacity less than 5%. Further, in some embodiments, the elastic strain capacity of the soft-elastic regions 110 may be in the range of 10% to 100%, and the elastic strain capacity of the hard-elastic regions 120 may be in the range of 0.1% to 25%. Further, a modulus of the hard-elastic regions 120 may generally be less than 0.1 times a modulus of the soft-elastic regions 110.

FIG. 2 is a cross-sectional schematic of a substrate 200 with the architecture provided in FIG. 1. In this embodiment, a soft-elastic region 210 is segregated through the bulk of the substrate 200 from the stiff-elastic regions 220. In such an architecture, the method of preparing spatially-anisotropic properties was performed in such a fashion as to enable the stiff-elastic regions 220 to extend throughout the thickness of the substrate 200. As such, the deformation of the substrate 200 along the major axes (i.e., length and width) would result in isotropic stress on the interface between the soft-elastic region 210 and the stiff-elastic regions 220.

FIG. 3 is a cross-sectional schematic view of a substrate 300 of an additional embodiment of the architecture provided in FIG. 1. In the illustrated embodiment, a soft-elastic region 310 is patterned such that the anisotropic properties of stiff-elastic regions 320 diffuse spherically within the soft-elastic regions 310. In this example, the stiff-elastic regions 320 do not extend through the thickness of the soft-elastic region 310. As such, the deformation of the substrate material along the major axes (length and width) would result in anisotropic stress on the interface between the soft-elastic region 310 and stiff-elastic regions 320 with stresses greatest at the surface of the stiff-elastic regions 320. It may be appreciated that devices built on materials with a cross-sectional morphology similar to FIG. 3 may have more strain capacity than devices built on materials with a cross-sectional morphology similar to FIG. 2. Further, in some instances, the morphology of FIG. 3 may generally be the only morphology available for some industrial processes that may allow for an isotropic material to be transformed into a mechanically-anisotropic material, as shown in FIG. 3. That is, some processes may be depth limited in nature, and those devices may never reach a full depth of a substrate film. This may hold especially true in an embodiment involving a relatively thick substrate.

Figure 4:
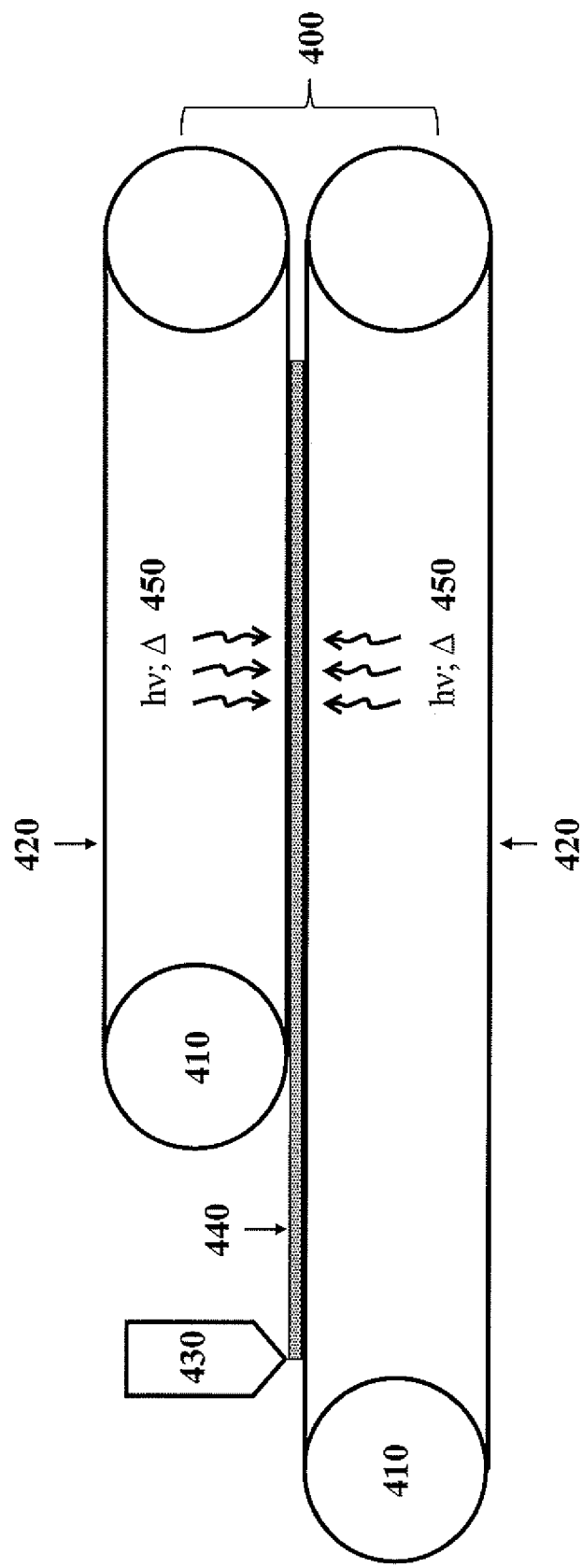
FIG. 4 is a schematic view of a roll-to-roll setup for manufacturing thin film substrates of anisotropically-patterned liquid crystal substrates in accordance with the embodiments disclosed herein.

FIG. 4 is a schematic view of a roll-to-roll setup 400 for manufacturing thin film substrates of anisotropically-patterned liquid crystal substrates. Two rolling assemblies 410 with pre-patterned command surfaces 420 are offset by a distance that enable a coating mechanism (e.g., slot-die, blade, etc.) 430 to dispense a liquid crystal monomer solution film 440 onto a first command surface 420. This solution then enters the second command surface at the second rolling assembly 410, where it can be cured via the introduction of thermal or electromagnetic energy 450.

Figure 5:
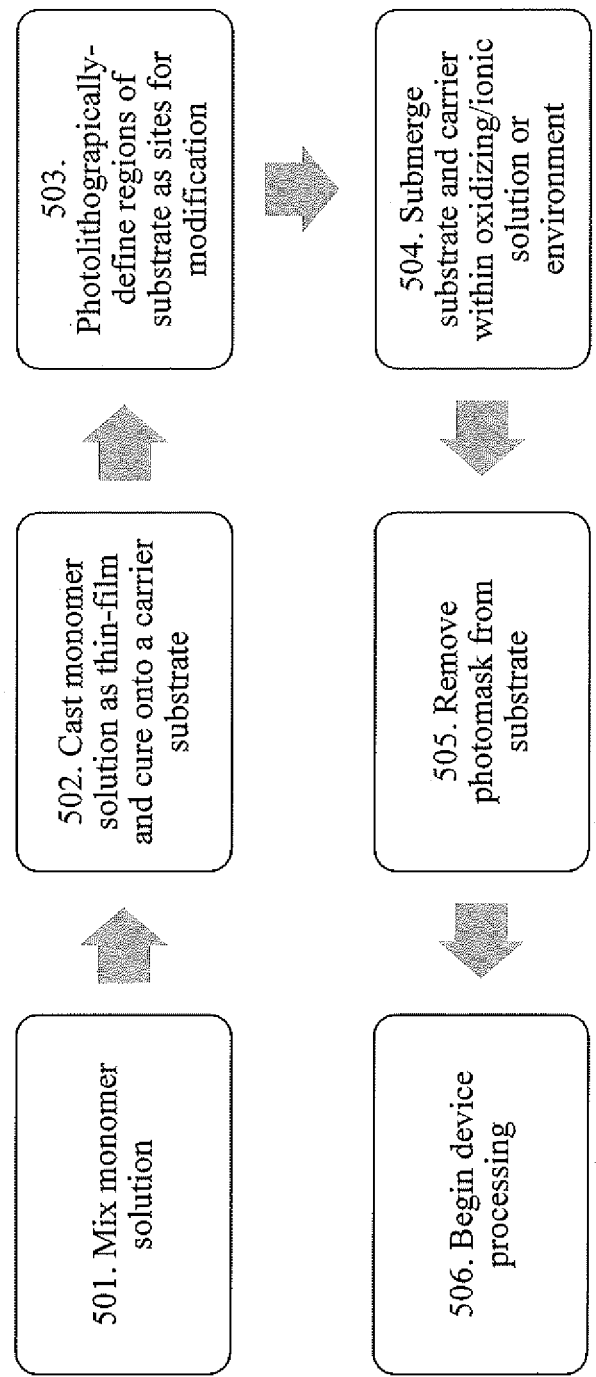
FIG. 5 is a flow-chart of a manufacturing process for thin film substrates of spatially-patterned ion-exchanged ionomers or oxidized thiol-click polymer in accordance with the embodiments disclosed herein.

FIG. 5 is a flow-chart of a manufacturing process 500 for thin film substrates of spatially-patterned ion-exchanged ionomers or oxidized thiol-click polymer. Briefly, at block 501, the monomer solution is mixed, and, at block 502, the monomer solution is cast as a thin-film, then further cured onto a carrier substrate. At block 503, spatially-discrete regions atop the substrate are photolithograpically-defined as sites for mechanical property modification. Subsequently, at block 504, the substrate and carrier are submerged within an oxidizing/ionic solution or environment, after which, at block 505, the photomask is removed from substrate. At block 506, device processing may begin atop the substrate, focusing the fabrication of strain-intolerant materials on oxidized/ion exchanged regions and strain-tolerant materials on the native substrate.

The manufacturing process 500 is described above with a polymer beginning as a soft substrate, and unmasked portions of the polymer are exposed to the oxidizing/ionic solution or environment to transform the unmasked portions of the polymer to a stiff substrate. In another embodiment, the polymer may begin as a stiff substrate, and unmasked portions of the polymer are exposed to an environment that transforms the unmasked portions of the polymer to a soft substrate. In such an embodiment, only the hard elastic regions 120 are masked during the manufacturing process 500.

While physically creating the stiff regions out of isotropically soft material is described previously in the detailed description, the method to generate through-thickness stiff regions (FIG. 2) or partial-depth stiff regions (FIG. 3) is dependent on the methodology used for creating the stiff region. In the case of utilizing directorate orientation, through-thickness stiff regions are achieved inherent to the manufacturing process described above. However, if one of the command surfaces is removed from the process and the film is allowed to form with one face open to environmental conditions, the film will be aligned homeotropically (i.e., alignment perpendicular to the substrate). Through this method, the films would exhibit two-dimensional anisotropy solely on the face of the film which was exposed to a command surface, while the backside of the film would demonstrate mechanical isotropy in the two planar dimensions of the substrate.

For ion-exchanged ionomers and oxidized thiol-click polymers, the method to generate through-thickness stiff regions (e.g., as shown in FIG. 2) or partial-depth stiff regions (e.g., as shown in FIG. 3) is dependent on the duration of the exposure to the oxidizing/ionic solution or environment described at block 504. By way of a sufficiently-long exposure that accounts for both the diffusion constant of the oxidizing/ionic solution or gas, as well as the thickness of the polymer film, a morphology similar to FIG. 2 may be present through the thickness of the film. However by reducing the exposure time, the depth that the stiff elastic region penetrates into the sample can be reduced (e.g., as shown in FIG. 3) as a function of the fraction of exposure time compared to the total time used to reach the morphology in FIG. 2.

EXAMPLES

The present disclosure can be better understood by reference to the following examples, which are offered by way of illustration. The present disclosure is not limited to the examples given herein.

Example 1

To a fluid reservoir was added the difunctional acrylate-terminated nematic liquid crystal RM 82 (Synthon) and an almost stoichiometric ratio of n-butylamine. To this solution, 1.5 wt % of the initiator 2,2-Dimethoxy-2-phenylacetophenone was added and the container was sealed, placed into the rotary mixer and mixed at 2350 rpm for 5 minutes. The monomer solution mixture was mounted to a slot-die coating tool and processed into a thin-film atop a carrier substrate with a prepatterned photoaligned dye layer via the slot-die coating technique. A secondary prepatterened photoaligned dye layer was used to cover the deposited material and allow directorate orientation across the thickness of the material. After 120 minutes, the secondary layer was removed and the material atop the carrier substrate was introduced to an ultraviolet (UV) curing oven and exposed to 10 mJ/cm^2 of 365 nm light to initiate the polymerization, giving the final polymer film. No further spatial patterning is required for the bulk polymer film to introduce spatial anisotropy of mechanical properties. The polymer network is now a spatially-anisotropic substrate for flexible electronics fabrication, wherein electronic elements that cannot accommodate significant strains can be processed directly atop the regions with a directorate orientation parallel (0°) to the expected direction of stretching and stretchable interconnects can be utilized to connect such elements.

Example 2

To a fluid reservoir was added the multifunctional thiol monomer Tris[2-(3-mercaptopropionyloxy)ethyl] isocyanurate (1 mol eq.) and the multifunctional co-monomer Tris (4-hydroxyphenyl)methane triglycidyl ether (1 mol eq.), and the container was sealed. The sealed container was placed into a rotary mixer and mixed at 2350 rotations per minute (rpm) for 5 minutes. The container was removed from the mixer, opened, and 1.5 wt % of the catalyst tripropylamine was pipetted dropwise into the mixed monomer solution at room temperature (about 25° C.). The container was again sealed, placed into the rotary mixer and mixed at 2350 rpm for an additional 5 minutes. Finally, the container was again removed from the mixer, opened, and the organic solvent tetrahydrofuran was added until the final solution was a 92.5% (v/v) solid-fraction monomer solution. The monomer solution mixture was mounted to a slot-die coating tool and processed into a thin-film atop a carrier substrate via the slot-die coating technique. The cast monomer solution was introduced to a curing oven at 65° C. to initiate the polymerization, as well as evaporate the excess tetrahydrofuran, and baked for at least 1 hour, giving the final polymer film. After the polymerization, the polymer film (either on the carrier substrate or separated therefrom) was spatially-patterned using standard semiconductor lithographic processing. Atop the patterned film, an excess of 30% $H_2O_2$ was added and allowed to soak for 60 minutes at 80° C. The solution is then flushed with deionized water, the remaining mask is removed and the bulk substrate is baked at 85° C. for 12 hours. The polymer network is now a spatially-anisotropic substrate for flexible electronics fabrication, wherein electronic elements that cannot accommodate significant strains can be processed directly atop the oxidized regions and stretchable interconnects can be utilized to connect such elements.

Example 3

A stock solution of poly(ethylene-co-acrylic acid) in xylene (5 v/v %) was mounted to a slot-die coating tool and processed into a thin-film atop a carrier substrate via the slot-die coating technique. Samples were the baked at 80° C. in an oven with dry nitrogen flow for 12 hours. The final film was spatially-patterned using standard semiconductor lithographic processing. Atop the patterned film, an excess of a 1.0 M NaOH solution was introduced and soaked for 60 minutes at room temperature. The solution is then flushed with deionized water and the remaining mask is removed. The polymer network is now a spatially-anisotropic substrate for flexible electronics fabrication, wherein electronic elements that cannot accommodate significant strains can be processed directly atop the sodium-salt regions and stretchable interconnects can be utilized to connect such elements.

As used herein, a polymer network may include either a covalently or physically linked material consisting of small organic molecules (i.e., monomers) that are connected to all other organic molecules (i.e., monomers) in the material via a multitude of pathways. In covalently linked networks, the individual monomers are covalently linked to form linear polymers (i.e., a macromolecule), which are additionally covalently linked to other linear polymers in the material. In physically linked networks, the individual monomers may still be covalently linked to form linear polymers (i.e., a macromolecule), however chains are only physically linked through processes such as, but not limited to, interpenetration, crystal formation, and secondary interactions (e.g., hydrogen bonding, Pi—Pi stacking).

What is claimed is:
1. A method of manufacturing a bulk substrate for stretchable electronics comprising:
    dispensing a monomer mixture atop a carrier substrate;
    curing a monomer mixture into a polymer film atop a carrier substrate;
    patterning the polymer film to cover a first region of the polymer film and expose a second region of the polymer film; and
    oxidizing exposed portions of the polymer film to create the bulk substrate, wherein the bulk substrate comprises:
        a soft-elastic region comprising an elastic limit of greater than 25% and a first Young's modulus less than 50 MPa; and
        a stiff-elastic region comprising an elastic limit of less than 5% and a second Young's modulus greater than 50 MPa; wherein the elastic limit is the yield strength after which the deformations are plastic.

2. The method of claim 1, wherein oxidizing to create the bulk substrate further comprises forming the soft-elastic region and the stiff-elastic region in a single continuous material.

3. The method of claim 1, wherein the bulk substrate does not comprise adhered interfaces having spatially controlled regions of variable Young's modulus.

4. The method of claim 1, comprising fabricating electronic stacks atop the stiff-elastic region of the bulk substrate.

5. The method of claim 1, wherein oxidizing portions of the polymer film to create the bulk substrate comprises creating the stiff elastic region that extends through an entire thickness of the bulk substrate.

6. The method of claim 1, wherein oxidizing portions of the polymer film to create the bulk substrate comprises creating the stiff-elastic region comprising a hemispherical shape within the soft-elastic region.

* * * * *